United States Patent
Itabashi et al.

(10) Patent No.: US 9,030,257 B2
(45) Date of Patent: May 12, 2015

(54) DIFFERENTIAL CIRCUIT COMPENSATED WITH SELF-HEATING EFFECT OF ACTIVE DEVICE

(71) Applicant: Sumitomo Electric Industries, Ltd., Osaka-shi, Osaka (JP)

(72) Inventors: Naoki Itabashi, Yokohama (JP); Yoshiyuki Sugimoto, Yokohama (JP); Makoto Ito, Yokohama (JP); Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/688,671

(22) Filed: Nov. 29, 2012

(65) Prior Publication Data
US 2013/0142522 A1    Jun. 6, 2013

(30) Foreign Application Priority Data

Dec. 2, 2011   (JP) ................................ 2011-264779
May 1, 2012    (JP) ................................ 2012-104628

(51) Int. Cl.
*H03F 3/45*    (2006.01)
*H04B 10/60*   (2013.01)

(52) U.S. Cl.
CPC ............ *H04B 10/60* (2013.01); *H03F 3/45179* (2013.01); *H03F 3/45085* (2013.01); *H03F 3/45475* (2013.01); *H03F 3/45973* (2013.01); *H03F 2203/45166* (2013.01)

(58) Field of Classification Search
CPC ............ H03F 3/45479; H03F 3/45071; H03F 3/45085; H03F 1/302; H03F 1/3211; H03F 2200/294; H03F 2200/372; H03F 2200/451; H03F 3/45475; H03F 1/26; H03F 3/087; H03F 3/08; H03F 3/082
USPC ........................ 330/252–261, 308; 250/214 A
See application file for complete search history.

(56) References Cited

U.S. PATENT DOCUMENTS 7,755,434 B2 *   7/2010   Hara et al. .................... 330/308

FOREIGN PATENT DOCUMENTS

| JP | 7-240640 | 9/1995 |
|----|----------|--------|
| JP | 2000-349571 | 12/2000 |
| JP | 2010-136169 | 6/2010 |

* cited by examiner

*Primary Examiner* — Hieu Nguyen
(74) *Attorney, Agent, or Firm* — Smith, Gambrell & Russell LLP

(57) ABSTRACT

A differential circuit with a function to compensate unevenness observed in the differential gain thereof is disclosed. The differential circuit provides a low-pass filter in one of the paired transistors not receiving the input signal in addition to another low-pass filter that provides an average of output signals as a reference level of the differential circuit. The cut-off frequency of the filter is preferably set to be equal to the transition frequency at which the self-heating effect explicitly influences the trans-conductance of the transistor.

6 Claims, 10 Drawing Sheets

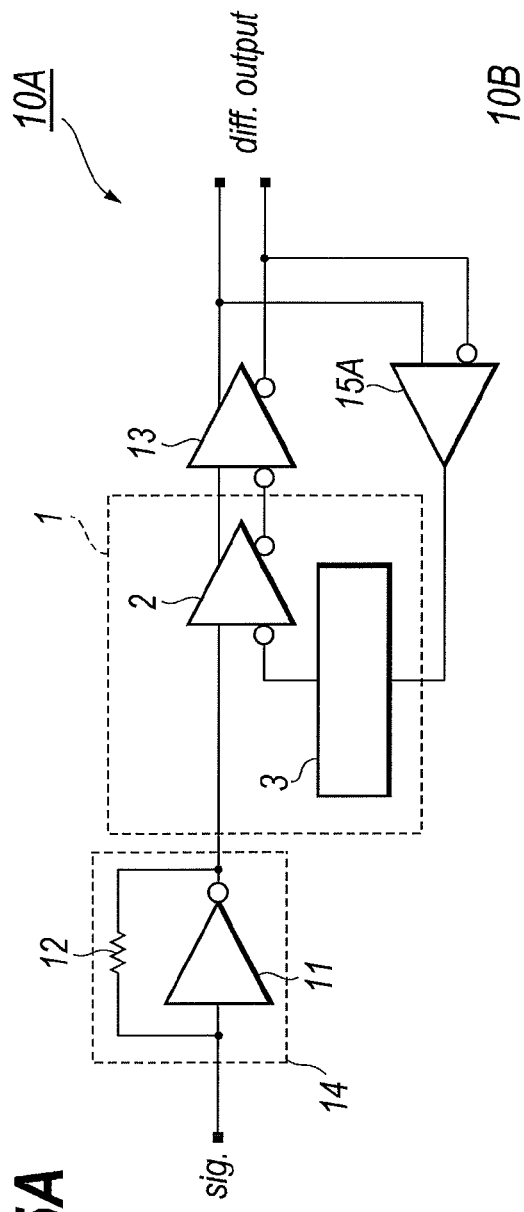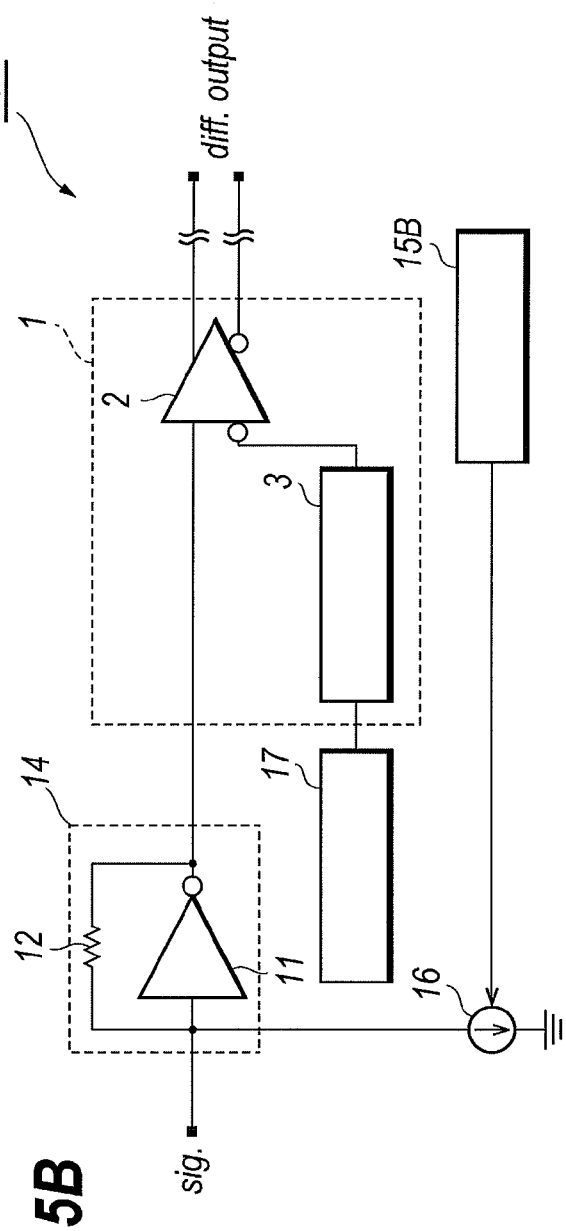
Fig. 5A
Fig. 5B

DIFFERENTIAL CIRCUIT COMPENSATED WITH SELF-HEATING EFFECT OF ACTIVE DEVICE

BACKGROUND OF THE INVENTION

1. Field of the Invention

The present invention relates to a differential circuit.

2. Related Background Arts

An optical receiver generally includes a differential circuit to convert a voltage signal with the single phase configuration into two signals with the differential configuration. The differential circuit generally shows an uneven frequency response, specifically, the differential gain thereof rises about a few decibels (dB) in low frequencies below, for instance, 100 kHz. This is because of, what is called, the self-heating of active devices typically bipolar transistors implemented within the differential circuit. The present application provides techniques to compensate this unevenness observed in the differential gain against the frequency.

SUMMARY OF THE INVENTION

One aspect of the present application relates to a differential circuit that includes an amplifying unit and a first low-pass filter. The amplifying unit has a pair of transistors to convert a mono-phase input signal received by one of the paired transistors into two output signals complementary to each other. The first low-pass filter, which is coupled with the other of the paired transistors, has a cut-off frequency smaller than a transition frequency of the other of the paired transistors. A feature of the differential circuit is that the other of the paired transistors shows a self-heating effect below the transition frequency, which enhances the differential gain of the differential circuit and causes an uneven frequency response.

The amplifying unit further includes a current source commonly connected to the paired transistors. The current source includes a source transistor. A further feature of an embodiment of the invention is that this source transistor is driven in the operational mode of the constant base current, not the constant collector current. Because the source transistor is driven by such a manner, the scattering of the current gain caused in the other of the paired transistors is cancelled by the source transistor driven in the constant base current. A still further feature of an embodiment of the invention is that the current source includes another current source for defining the constant base current. Moreover, the other current source is determined by the reference resistor and a bias voltage applied thereto. Then, the scattering of the resistance of a resistor constituting the low-pass filter coupled with the other of the paired transistors is compensated by the reference resistor. The scattering of the resistance of the resistor in the low-pass filter has tendency same with the scattering of the resistance of the reference resistor.

Another aspect of the present application relates to an optical receiver to receive an optical signal and output electrical signals complementary to each other. The optical receiver includes a trans-impedance amplifier (TIA), a differential circuit, and a feedback unit. The TIA converts a photocurrent corresponding to the received optical signal into a voltage signal. The differential circuit converts the converted voltage signal into the output output electrical signals. The differential circuit includes an amplifying unit and a compensating unit. The feedback unit generates a difference between the output electrical signals.

A feature of the optical receiver according to embodiments is that the amplifying unit includes a pair of transistors and a current source commonly connected to the paired transistors to provide a current. One of the paired transistors receives the voltage signal, while, the compensating unit includes a first low-pass filter and a second low-pass filter. The first low-pass filter is coupled with the other of the paired transistors not receiving the voltage signal. The second low-pass filter averages the difference output from the feedback unit and provides the averaged difference to the other of the paired transistors via the first low-pass filter. The first low-pass filter has a cut-off frequency greater than the cut-off frequency of the second low-pass filter but smaller than a transition frequency attributed to a gain of the other of the paired transistors.

The other of the paired transistors has the gain in frequencies less than the transition frequency greater than the gain in frequencies higher than the transition frequency. The current source includes a source transistor driven under the operational mode of the constant base current, not the constant collector current. The source transistor and the other of the paired transistors each has the current gain, a value of which scatters around respective center values and the scattering shows tendency similar to each other. The constant base current is provided from another current source including a reference resistor. The resistance of this reference resistor scatters around a center value thereof. Concurrently, the scattering of the resistance of the reference resistor has tendency similar to the scattering of the resistance of the resistor constituting the first low-pass filter.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

FIGS. 5A and 5B are functional block diagrams of optical receivers each implemented with the differential circuit shown in FIG. 1;

DESCRIPTION OF PREFERRED EMBODIMENTS

Next, some exemplary embodiments according to the present invention will be described as referring to drawings. In the description of the drawings, numerals or symbols same or similar to each other will refer to elements same or similar to each other without overlapping explanations.

First Embodiment

Figure 1:
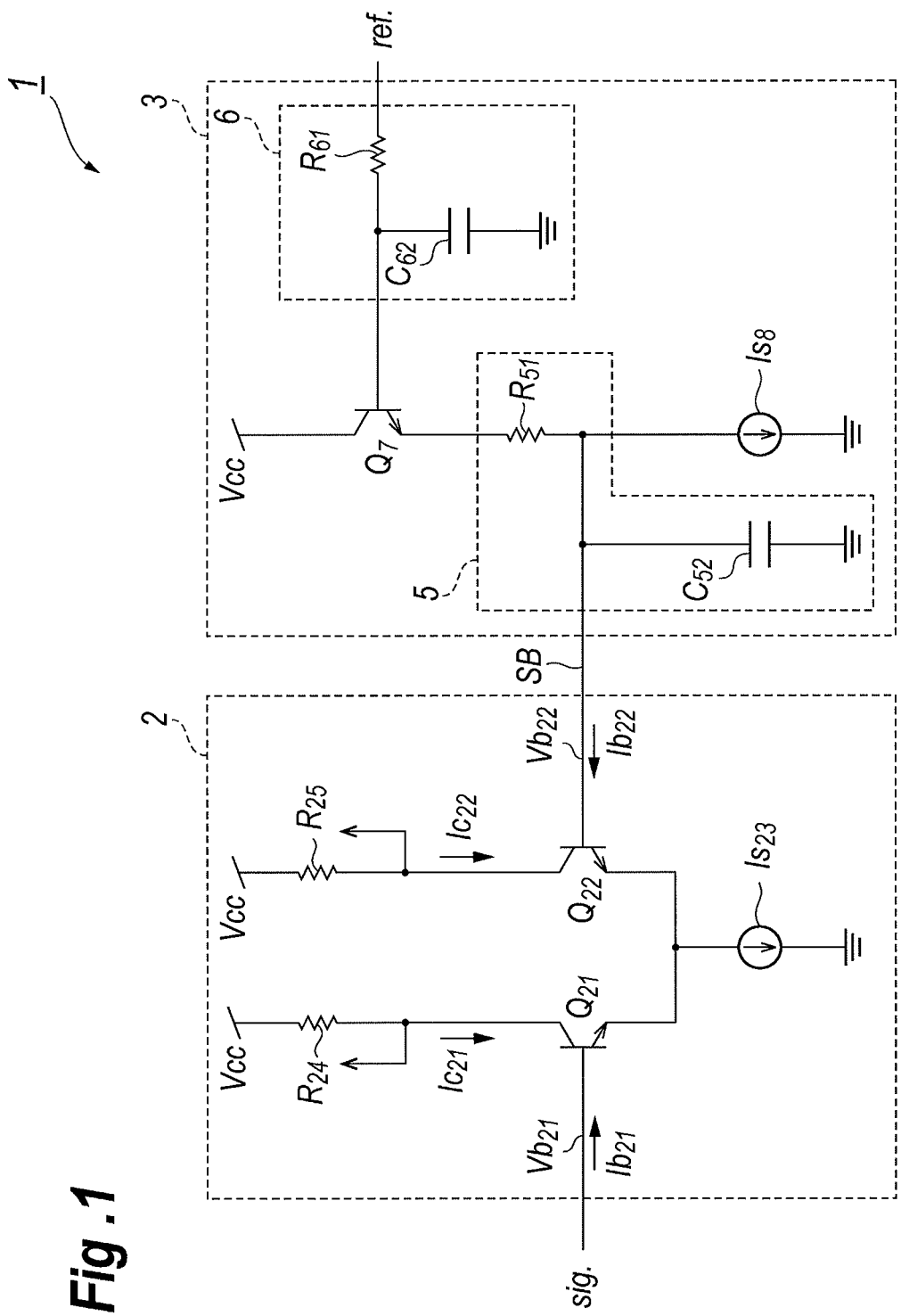
FIG. 1 is a circuit diagram of a differential circuit according to the first embodiment of the invention.

FIG. 1 is a circuit diagram of a differential circuit according to the first embodiment of the invention. The differential circuit 1, which converts a signal with a mono-phase into a differential signals complementary to each other, includes an amplifying unit 2 and the compensating unit 3. Such a differential circuit 1 shown in FIG. 1 is preferably applicable to an optical receiver of the optical communication system, in particular, as a unit to convert a voltage signal with a mono-phase that reflects an optical input power into signals complementary to each other.

The amplifying unit 2 includes a pair of transistors, $Q_{21}$ and $Q_{22}$, a pair of load resistors, $R_{24}$ and $R_{25}$, and a current source $Is_{23}$. The paired transistors, $Q_{21}$ and $Q_{22}$, are a type of npn-bipolar transistor, which is preferably a hetero-bipolar-transistor (HBT) with the emitter commonly connected to the current source $Is_{23}$, the collector coupled with respective load resistors, $R_{24}$ and $R_{25}$, and the base coupled to the input and to the compensating unit 3.

Figure 3:
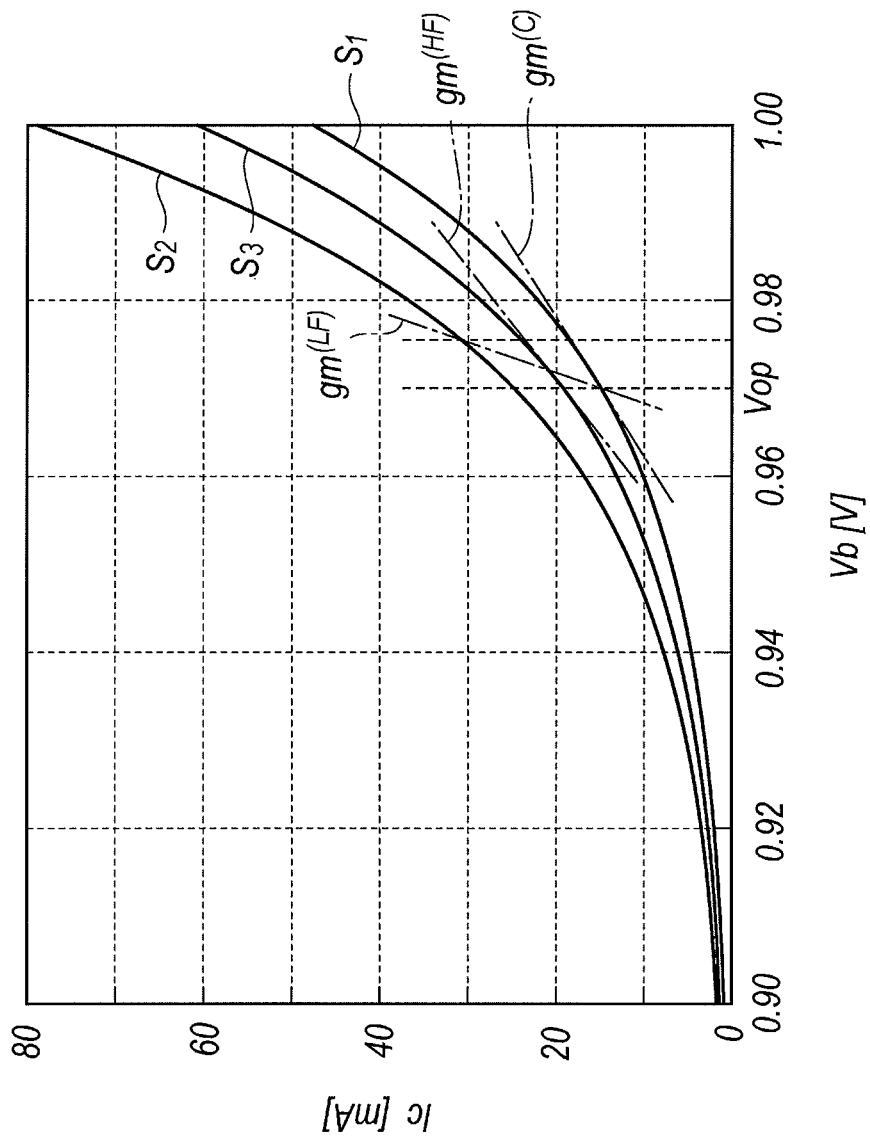
FIG. 3 shows transfer curves of the collector current against the base voltage when the self-heating is out of consideration $S_1$, when the channel is heated by current S2, and when the change of the temperature cannot follow the frequency of the signal $S_3$, respectively.

The performance of an HBT will be further described. FIG. 3 shows behaviors of the collector current against the base voltage, where the slope of the behaviors corresponds to the trans-conductance of a bipolar transistor. A behavior $S_1$ corresponds to a status when a temperature thereof is T, $S_2$ corresponds to a temperature of T+ΔT, and $S_3$ corresponds to a temperature between T and T+ΔT. Neglecting the self-heating effect of an HBT, the temperature of the HBT becomes constant to be T. Operating an HBT at a bias of Vop under such a condition where the device temperature is kept constant in T, the collector current is given by the behavior $S_1$ and the trans-conductance (∂Ic/∂Vb) becomes $gm^{(C)}$ at the operating point Vop.

The current source $Is_{23}$, which is a type of the constant current source, provides current to respective transistors, $Q_{21}$ and $Q_{22}$, but a sum of currents flowing in respective transistors, $Q_{21}$ and $Q_{22}$, are kept constant to be equal to the constant current defined by the current source $Is_{23}$. The load resistors, $R_{24}$ and $R_{25}$, are coupled between the collector of respective transistors, $Q_{21}$ and $Q_{22}$, and the positive power supply Vcc.

Figure 2:
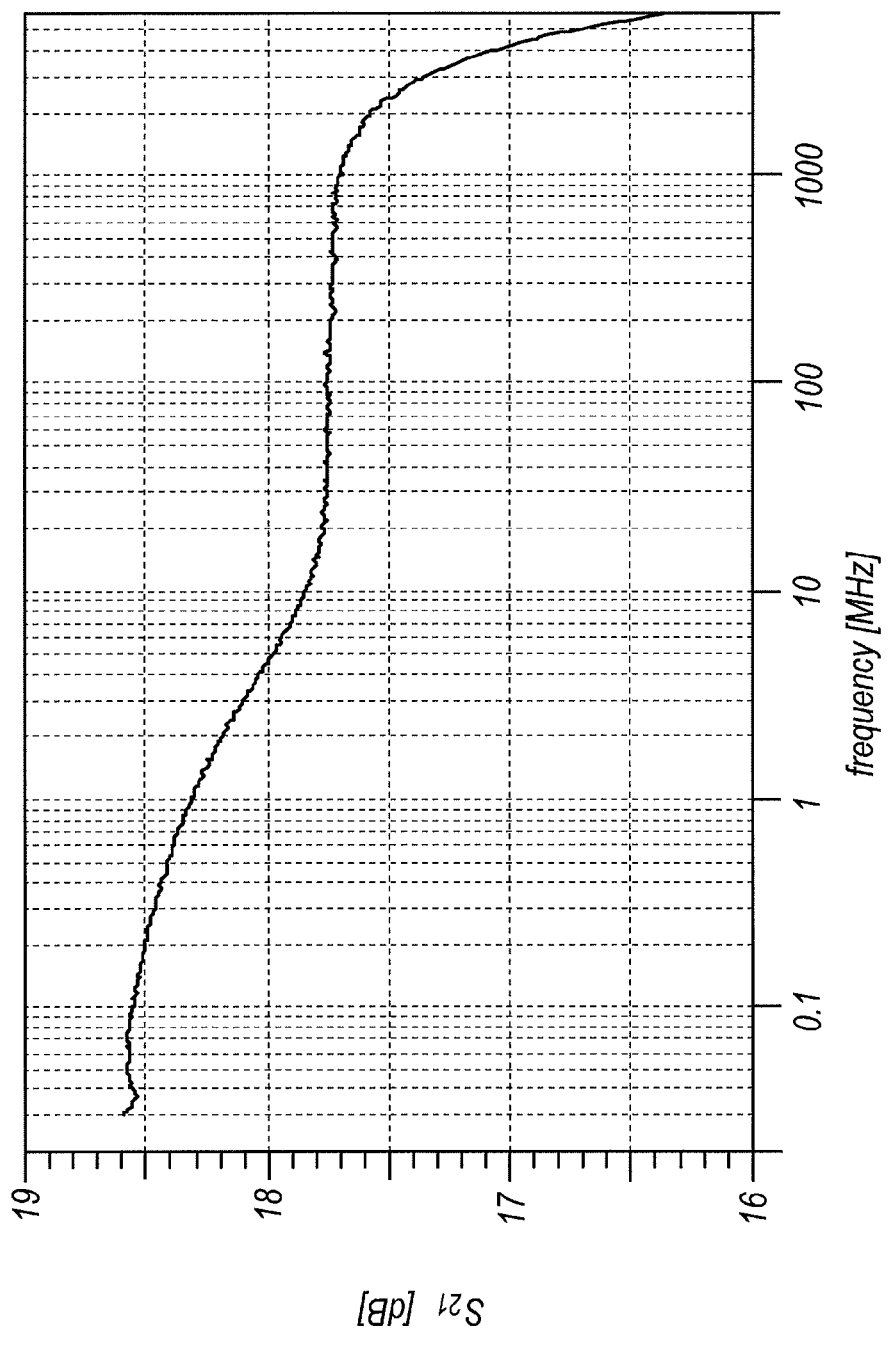
FIG. 2 shows a behavior of s-parameter $S_{21}$ of an HBT against frequencies.

The frequency response of an HBT will be described by one s-parameter $S_{21}$ as a reference. FIG. 2 shows the behavior of the s-parameter $S_{21}$ of an HBT against frequencies. As shown in FIG. 2, $S_{21}$ shows a substantially flat response in a region from 20 MHz to 1 GHz. However, it increases as the frequency decreases below 10 MHz. That is, the gain of an HBT becomes greater in low frequencies compared to that in high frequencies. The description provided below assumes that a frequency at which the gain $S_{21}$ increases as the frequency decreases is called as the transition frequency.

Taking the self-heating effect of an HBT, that is, the channel of an HBT is heated by carriers flowing therein, which raises a temperature of the channel by ΔT to shift the behavior Ic-Vb from $S_1$ to $S_2$. In such a case, the trans-conductance is given by a slope of the line connecting the point on $S_1$ corresponding to the condition of no carriers flowing with another point on $S_2$ corresponding to the condition of carriers flowing, which is denoted by $gm^{(LF)}$ in FIG. 3. The response of the channel temperature gradually becomes unable to follow the carrier flow therein as the frequency increases, the transfer curve Ic-Vb moves to $S_3$ and the trans-conductance becomes the slope of the tangential line drawn from a point at which the line connecting two operating points crosses the behavior $S_3$, which is denoted by $gm^{(HF)}$, trans-conductance becomes the slope of the tangential line drawn from a point at which the line connecting two operating points crosses the behavior $S_3$, which is denoted by $gm^{(HF)}$.

A crossover frequency over which the fluctuation of the channel temperature of HBT is unable to follow the signal frequency, which can be evaluated by thermal resistance and heat capacity of an HBT, substantially becomes consistent with the transition frequency thereof. That is, the trans-conductance of an HBT is influenced by the self-heating below the transition frequency, while, it becomes substantially constant in a region over the transition frequency, which results in a characteristic that the trans-conductance in low frequencies $gm^{(LF)}$ becomes greater than the trans-conductance in high frequencies $gm^{(HF)}$. Thus, the gain of HBT becomes greater in lower frequencies.

The amplifying unit 2 in FIG. 1 shows an uneven frequency response because the circuit is comprised of HBTs whose gain shows the frequency dependence described above; specifically, the gain thereof becomes greater in low frequencies compared to that in high frequencies. Then, compensation is necessary to even the frequency response.

Referring back to FIG. 1 again, the compensating unit 3, which compensates the frequency response of the amplifying unit 2, includes the first filter 5 comprised of a resistor $R_{51}$ and a capacitor $C_{52}$, where they constitute a first low-pass filter with an output thereof SB provided to the base of one of the paired transistors $Q_{22}$.

The cut-off frequency $fc_1$ of the first filter 5, which is determined by the product of the resistance of the resistor $R_{51}$ and the capacitance of the capacitor $C_{52}$, is preferably set to be substantially equal to the transition frequency of the transistors, $Q_{21}$ and $Q_{22}$. Details of how we determine the resistance and the capacitance will be described later.

The compensating unit 3 further includes the second filter 6 put in upstream of the first filter 5. The second filter 6, which determines characteristics of the amplifying unit 2 in low frequencies, includes a resistor $R_{61}$ and a capacitor $C_{62}$. The second filter 6 also behaves as a low-pass filter with a cut-off frequency $fc_2$ lower than the first cut-off frequency $fc_1$, that is, the time constant of the second filter 6 is greater than the time constant of the first filter 5. The second filter 6 receives an output of the amplifying unit 2 via an offset compensator as a feedback unit, which is not illustrated in FIG. 1 but refer to FIG. 5A, extracts a DC component thereof and provides thus extracted DC component to the base of the transistor $Q_{22}$ via the first filter 5.

The compensating unit 3 further includes a buffer comprised of a collector grounded npn transistor $Q_7$, namely, the emitter follower between two low-pass filters, 5 and 6. The transistor $Q_7$ receives the reference signal whose high frequency components are cut by the second filter 6, and transfers thus cut reference signal to the amplifying unit 2. The buffer further includes a current source $Is_8$ to pull down the emitter level of the transistor $Q_7$. Because the transistor $Q_7$ is configured with, what is called, the emitter follower, not only the input impedance thereof becomes high so as not to influence the cut-off characteristic of the second filter 6 but also the output impedance thereof becomes small enough so as not to influence the cut-off frequency $fc_1$ of the first filter 5.

Next, an algorithm to determine the resistance of the resistor $R_{51}$ and the capacitance of the capacitor $C_{52}$ will be described. An extreme condition is first assumed where the capacitance $C_u$ is omitted, that is, a case where the first filter 5 operates only as an attenuator without any frequency characteristic. In such a case, the amplifying unit 2 would show a response similar to that of the s-parameter $S_{21}$ of an HBT shown in FIG. 2. Then, the low frequency gain $G_{LF}$ which is raised by the self-heating and the high frequency gain $G_{HF}$ which escapes from the self-heating are observed. For an exemplary condition shown in FIG. 2, the low frequency gain $G_{LF}$ and the high frequency gain $G_{HF}$ are 18.6 dB and 17.75 dB, respectively.

The trans-conductance gm of an HBT in high frequencies, the resistance R of resistor $R_{51}$, and the current gain $\beta$ (=Ic/Ib) of the transistor, $Q_{21}$ and $Q_{22}$, determine a ratio of two gains, or a difference between them in the decibel (dB) unit. That is, the difference between two gains is:

$$G_{HF} - G_{LF} = \Delta Vb_2 / \Delta Vb_1 = (gm/\beta) \times R. \quad (1)$$

Then, the capacitance C is determined such that the cut-off frequency $fc_1$ becomes substantially equal to the transition frequency, that is, from an equation of $fc_1 = 1/(2\pi \times R \times C)$. Most transistors or most HBT show the transition frequency from 2 to 4 MHz. For instance, setting the cut-off frequency $fc_1$ of the first filter 5 to be 2 MHz, the capacitance of the capacitor $C_{52}$ becomes about 200 pF.

Figure 4:
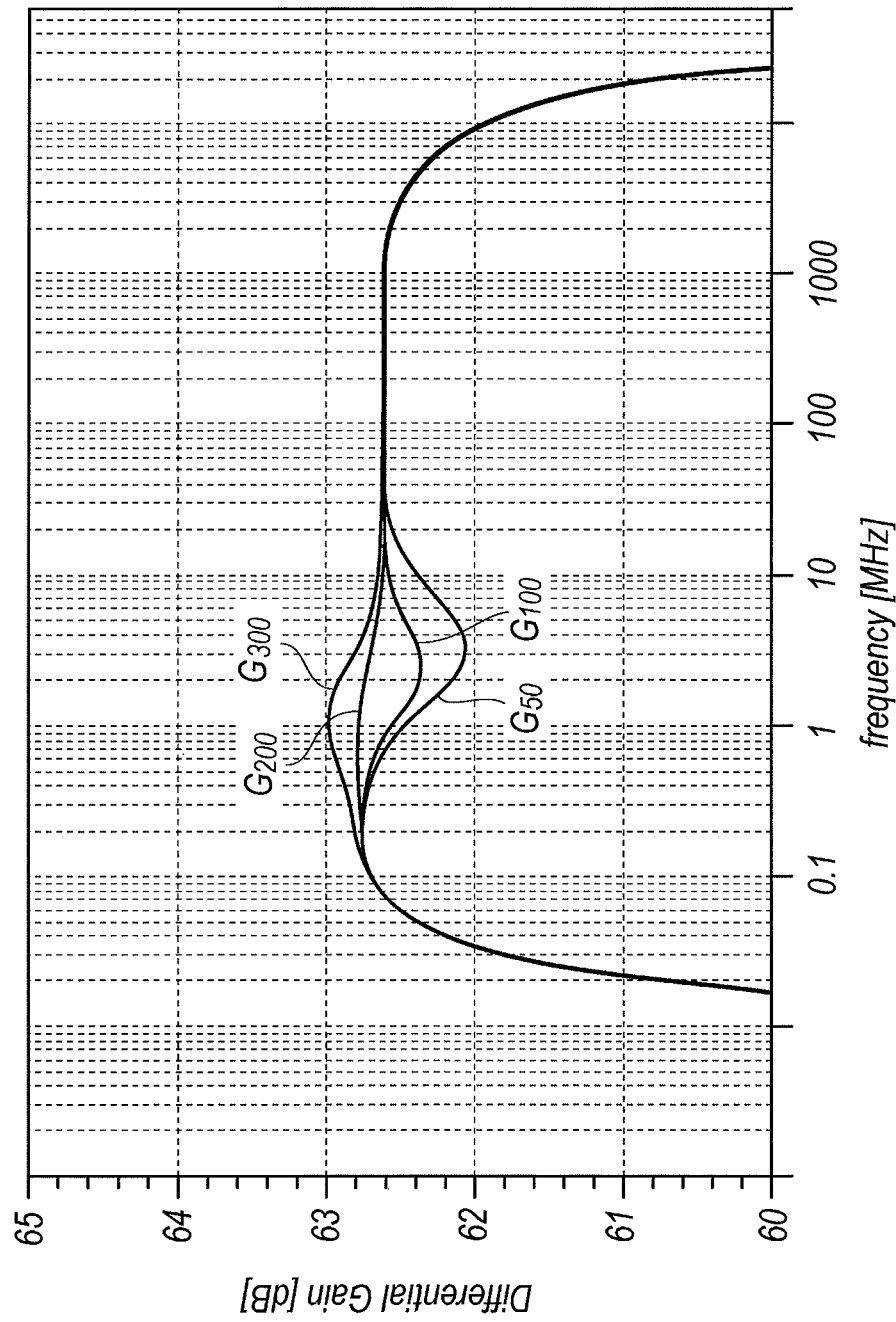
FIG. 4 compares the frequency response of the differential circuit 1 as varying the capacitance of the capacitor of the low-pass filter from 0 to 300 pF.

FIG. 4 compares the frequency response of the differential circuit 1 as varying the capacitance of the capacitor $C_{52}$, where the resistance of the resistor $R_{51}$ is set to be 400$\Omega$. Behaviors, $G_{50}$ to $G_{300}$, correspond to cases where the capacitance is 50 pF, 100 pF, 200 pF and 300 pF, respectively. As shown in FIG. 4, as the capacitance becomes smaller, the reduction of the high frequency gain begins at higher frequency. For instance, when the capacitance is set to be 50 pF, the decrease of the gain by the first filter 5 compensates the increase of the gain by the self-heating of the transistor at a frequency of about 0.1 MHz. However, the first filter 5 excessively compensates the self-heating effect between the cut-off frequency $fc_1$ and 0.1 MHz, where the frequency response causes a large dip.

On the other hand, when the capacitance is set larger, which lowers the cut-off frequency $fc_1$ of the first filter 5, the frequency response of the circuit begins to decrease in a relatively lower frequency. For instance, setting the capacitance to be 300 pF, the differential gain begins to decrease by the first filter 5 at a frequency lower than 1 MHz, while, the it shows a bulge around 1 MHz by insufficient compensation. When the capacitance is set to be 200 pF, the first filter 5 adequately compensates the increase of the differential gain due to the self-heating and the frequency response becomes substantially flat.

Next, operations of the differential circuit 1 will be described as referring to FIG. 1 again. The operation in low frequencies will be first described. Receiving the input monophase signal by the transistor $Q_{21}$, the base and emitter levels rise. Because the emitters of the paired transistors, $Q_{21}$ and $Q_{22}$, are commonly connected to the current source $Is_{23}$, the base-emitter bias $Vbe_2$ of the transistor $Q_{22}$ decreases as the common emitter level rises. Then, the current $Ib_{22}$ flowing into the base of the transistor $Q_{22}$ is decreased. This base current $Ib_{22}$ also flows in the resistor $R_{51}$ to cause a voltage drop thereat. The reduction of the base current $Ib_{22}$ automatically decreases this voltage drop but raises the base level thereof. Thus, the fluctuation of the base level of one of the paired transistors $Q_{22}$ occurs in a phase same to the fluctuation of the base level caused in the other transistor $Q_{21}$. Accordingly, the differential gain of the amplifying unit 2 is decreased.

On the other hand, the capacitor $C_{52}$ is regarded as a short circuit in high frequencies, which makes the voltage drop caused in the resistor $R_{51}$ by the base current $Ib_{22}$ ignorable, the base level of the transistor $Q_{22}$ becomes substantially constant to prevent the reduction of the differential gain of the differential circuit 1. Thus, the differential circuit 1 with the compensating unit 3 can compensate the unevenness of the gain occurred in low frequencies without reducing the differential gain thereof.

Next, some variations of the differential circuit 1 will be described. FIG. 5A is a functional block diagram of an optical receiver 10A implemented with the differential circuit 1 shown in FIG. 1, and FIG. 5B is a functional block diagram of another optical receiver 10B also implemented with the differential circuit 1. The optical receiver 10A in FIG. 5A includes an inverting amplifier 11 with a feedback resistor 12, where they constitute a trans-impedance amplifier (hereafter denoted as TIA) 14, the differential amplifier 1 including the amplifying unit 2 and the compensating unit 3, the second differential amplifier 13, and the offset canceller 15A. The differential amplifier 1 receives a voltage output of TIA 14 in the base of one of the paired transistors, $Q_{21}$ and $Q_{22}$, shown in FIG. 1.

Outputs of the amplifying unit 2 are brought to the second differential amplifier 13. The outputs of the second differential amplifier 13 are not only extracted to the outside of the optical receiver 10A but brought to the offset canceller 15A. The offset canceller 15A amplifies a difference between two outputs of the second differential amplifier 13, and generates the reference to cancel this difference in the outputs, where the reference is fed back to the base of the other transistor $Q_{22}$ of the amplifying unit 2 via the compensating unit 3.

The optical receiver 10B shown in FIG. 5B includes a TIA 14, the differential amplifier 1 whose reference supplied to the base of the other transistor $Q_{22}$ is provided from a bias generator 17 via the compensating unit 3, an offset canceller 15B, and a current subtracter 16. The offset canceller 15B generates a control signal provided to the current subtracter 16 to bypass a current from a primary current attributed to the input signal. Thus, bypassing a portion of current incoming to the optical receiver 10B attributed to the input signal, which reduces a current flowing in the feedback resistor 12 of TIA 14 and an output level of TIA 14 varies, the difference of the output of TIA 14 from the reference provided from the bias generator 17 via the compensating unit 3 is cancelled.

The gain fluctuation inherently attributed to the differential circuit, which is often accompanied with low frequency characteristics of the circuit, is conventionally compensated by putting a compensating circuit, such as an equalizer comprised of resistors and capacitors, within transmission lines. However, capacitors with large capacitance are sometimes necessary to compensate the fluctuation, and unable to integrate within a circuit monolithically. An arrangement where the equalizer is placed outside of the differential circuit 1 requires complicated interconnections between the differential circuit and the equalizer. Such an arrangement often degrades the high frequency performance of the differential circuit.

On the other hand, the differential circuit 1 of an embodiment implemented in the optical receives, 10A and/or 10B, only provides the compensating unit 3 in one of inputs of the amplifying unit 2 to compensate the gain fluctuation in low frequencies. This not only simplifies the differential circuit 1 but also is realized by an integrated circuit.

Figure 6:
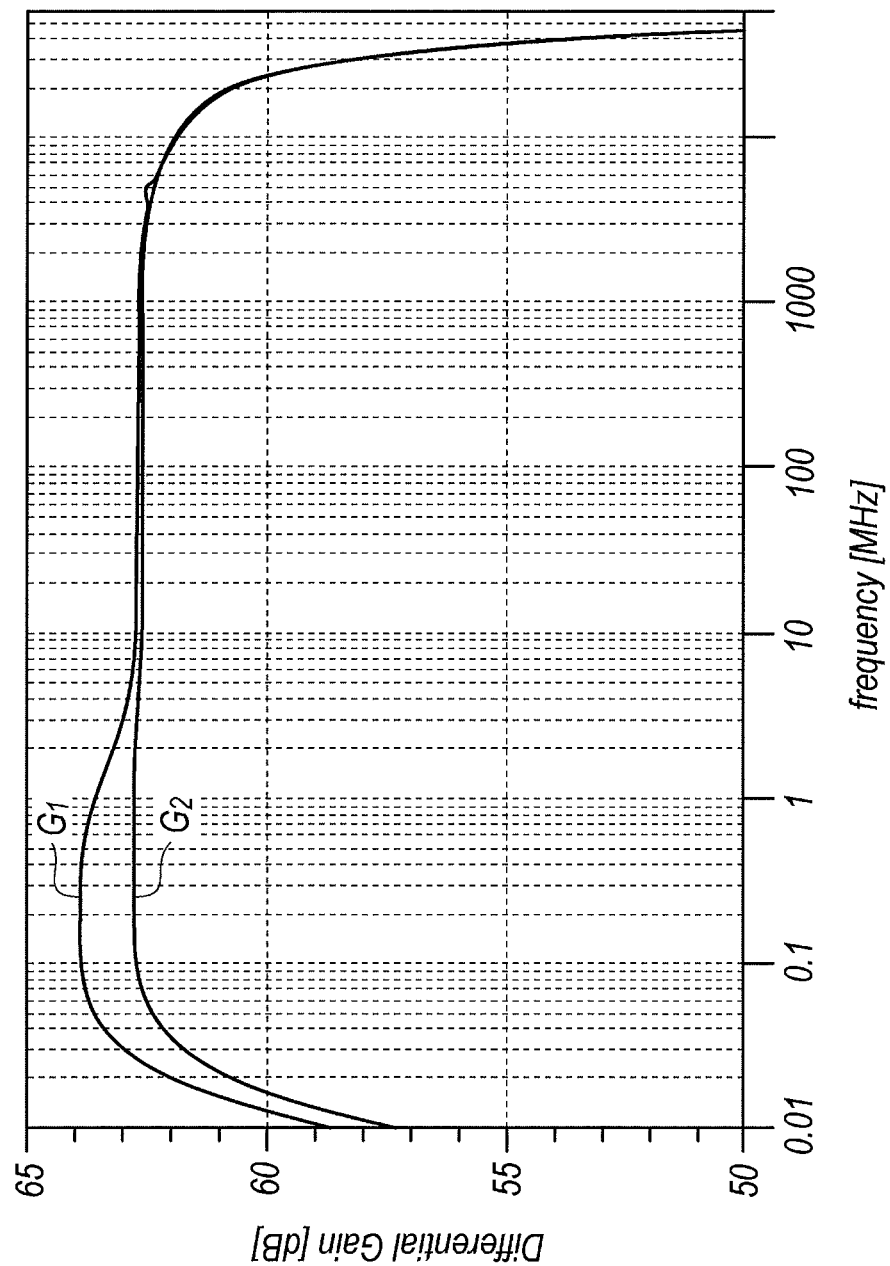
FIG. 6 compares the frequency response of the differential gain of the differential circuit without the low-pass filter $G_1$ and with the low-pass filter $G_2$ to compensate the gain in low frequencies.

The frequency response of the differential gain of the differential circuit 1 will be described as referring to FIG. 6 which shows the frequency response $G_2$ of the differential circuit 1 and that $G_1$ of a differential circuit without the compensating unit 3. In FIG. 6, the resistance and the capacitance of the first filter 5 are 400Ω and 200 pF, respectively. As shown in FIG. 6, the frequency response $G_1$ is substantially flat in 62.7 dB in a range from 10 MHz to 1 GHz, but clearly shows a bulge in low frequencies from 40 kHz to 4 MHz whose peak gain becomes about 64 dB. On the other hand, the differential circuit 1 with the compensating unit 3 shows a flat gain of 62.7 dB in a wide frequency region from 100 kHz to 1 GHz. Thus, the compensating unit 3 effectively reduces the differential gain in low frequencies without reducing the gain in high frequencies.

According to the differential circuit 1 of the present embodiment, the first filter 5, which is coupled with one of paired transistors $Q_{22}$ not receiving the input signal and having the cut-off frequency $fc_1$ substantially equal to the transition frequency below which the self-heating effect of a transistor explicitly occurs, raises the base level of the transistor coupled with the filter 5 in low frequencies. In such a condition of low frequencies, two transistors are operated in a common phase to suppress the differential gain. However, the first filter 5 causes no influence to the paired transistors in high frequencies. Then, the high frequency performance of the circuit is left unchanged. Thus, the gain fluctuation of the differential circuit 1 is effectively suppressed.

The buffer put between two filters, 5 and 6, isolates two functions, one of which is to generate a DC bias condition to cancel the output offset of the differential circuit 1, while, the other is to cancel the self-heating effect described above. Moreover, the buffer has the emitter follower not only to enhance the impedance against the former input, a difference between two outputs, but also to reduce the impedance for the base of the transistor $Q_{22}$.

Second Embodiment

In the differential circuit 1 of the first embodiment, the compensation of the differential gain in low frequencies is determined by, as shown in equation (1), the resistance R of the resistor $R_{51}$, the current gain $\beta_2$ of the transistor $Q_{22}$, and the trans-conductance $gm^{(H)}$ in high frequencies. However, the current gain $\beta_2$ has possibility to be scattered by many reasons during the processing thereof. Accordingly, the compensation for the differential gain in low frequencies also scatters. A differential circuit according to the second embodiment compensates the scattering of the current gain of transistors.

Figure 7:
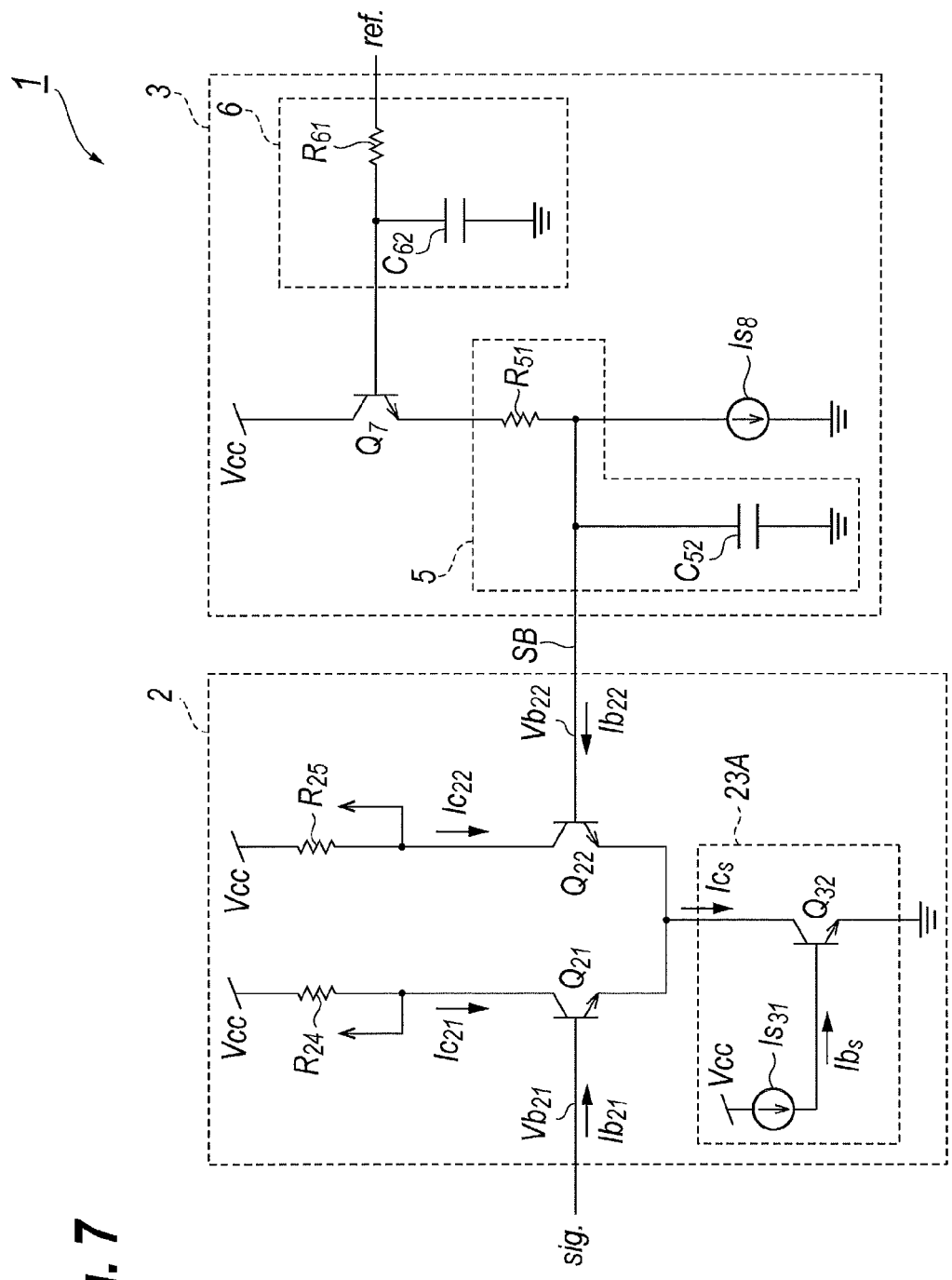
FIG. 7 is a circuit diagram of the differential circuit including a current source modified from the aforementioned current source $Is_{23}$ in FIG. 1.

FIG. 7 is a circuit diagram of the differential circuit 1A that includes a current source circuit 23A modified from the aforementioned current source $Is_{23}$ in the first embodiment. That is, although the aforementioned current source $Is_{23}$ is a constant current source, the second embodiment includes a transistor $Q_{32}$ and a current source $Is_{31}$ in the modified current source circuit 23A.

The current source $Is_{31}$ keeps the base current $Ib_s$ of the source transistor $Q_{32}$. The source transistor $Q_{32}$ is monolithically formed with the other transistors, $Q_{21}$ and $Q_{22}$, that is, the transistor $Q_{32}$ is formed simultaneously with those transistors, $Q_{21}$ and $Q_{22}$, by the same process. The current source $Is_{31}$ provides the base current $Ib_s$ of the source transistor $Q_{32}$, which generates the collector current $Ic_s$ determined by an equation of:

$$Ic_s = \beta_s \Delta Ib_s. \quad (2)$$

Considering the operation of the transistor $Q_{22}$, the trans-conductance gm of this transistor $Q_{22}$ is given by:

$$gm = \Delta Ic_2 / \Delta Vbe_2, \quad (3)$$

where $Vbe_2$ is the base-emitter bias. Thus, the trans-conductance is proportional to the collector current $Ic_2$. Also, the collector current $Ic_2$ is proportional to the current gain $\beta_2$ of this transistor $Q_{22}$. Assuming that the transistors, $Q_{21}$, $Q_{22}$, and $Q_{32}$, are formed simultaneously, and even the absolute value thereof is scattered, the behaviors of the scattering are same to respective transistors. That is, when the current gain $\beta_2$ of the transistor $Q_{22}$ becomes larger, the current gain $\beta_s$ of the source transistor $Q_{32}$ becomes also larger by almost same amount, or, the current gain $\beta_2$ of the transistor $Q_{22}$ becomes smaller, the current gain $\beta_s$ of the source transistor $Q_{32}$ also becomes smaller by the same amount.

Accordingly, the compensation of the differential gain in low frequencies becomes independent of the current gain $\beta_2$ of the transistor $Q_{22}$. In other words, even when the transistors are formed to have a larger current gain $\beta$, which operate to decrease the compensation of the differential gain in low frequencies but to increase the collector current $Ic_{22}$ of the transistor $Q_{22}$ and that $Ic_s$ of the source transistor $Q_{32}$ by the same amount, which increase the trans-conductance gm of the transistor $Q_{22}$ and the compensation of the differential gain in low frequencies also increases. Thus, the reduction of the gain compensation in low frequencies due to the increase of the current gain $\beta_2$ of the transistor $Q_{22}$ and the enhance of the gain compensation in low frequencies due to the increase of the current gain $\beta_s$ of the transistor $Q_{32}$ cancel to each other.

A differential circuit generally accompanies a current mirror circuit for the common current source to keep the collector current $Ic_s$ of the current source constant. That is, the current source with the current mirror circuit keeps the collector current $Ic_s$ of the source transistor by adjusting the base current $Ib_s$ thereof. On the other hand, the current source circuit 23A of the present embodiment includes a transistor $Q_{32}$ driven by the condition of the constant base current $Ib_s$, which results in a condition that the collector current $Ic_s$ thereof depends on the current gain $\beta$. Accordingly, even when the current gain $\beta_2$ of the transistor $Q_{22}$ varies due to the process instability, the current gain $\beta_s$ is of the transistor $Q_{32}$ traces this variation, which effectively compensates the instability of the compensation of the differential gain of the amplifying unit 2 in low frequencies.

Third Embodiment

The differential amplifier 1 according to the aforementioned embodiments compensates the enhancement of the differential gain in low frequencies by setting the base bias $Vb_{22}$, which is derived from the base current $Ib_{22}$ flowing in the resistor $R_{51}$, in the phase same with the base bias $Vb_{21}$ of the other transistor $Q_{21}$. However, the resistor $R_{51}$ also scatters the resistance thereof by, for instance, the process instability, which causes the fluctuation of the compensation amount in low frequencies.

The resistor $R_{51}$ with greater resistance than a designed value results in an excess compensation of the differential gain in low frequencies. On the other hand, when the resistance of the resistor $R_{51}$ is smaller than the designed value, the amount of the compensation becomes insufficient. In both cases, the frequency response of the amplifying unit 2 causes a fluctuation. Not only the scattering of the current gain β but the scattering of the resistance is preferably corrected.

Figure 8A:
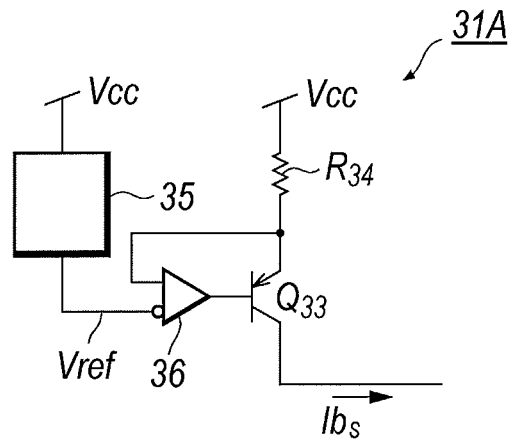
FIG. 8A shows the constant current source for the base current of the source transistor.

FIG. 8A is a circuit diagram of the differential circuit that compensates the differential gain in low frequencies by eliminating the influence of the scattering not only of the current gain β of the transistors but the resistance. The differential circuit includes the current source circuit 31A distinguishable from that of the aforementioned circuit. The current source circuit 31A to provide the base current $Ib_s$ to the source transistor $Q_{32}$, includes a transistor $Q_{33}$, a reference resistor $R_{34}$, a reference generator 35, and an amplifier 36.

The transistor $Q_{33}$, which is a pnp-type bipolar transistor, operates as a current booster, that is, the transistor $Q_{33}$ is driven by the differential amplifier 36, which may be a general purpose operational amplifier, and this amplifier 36 receives the constant voltage from the reference generator 35 in the inverting input thereof. Specifically, two inputs of the amplifier 36 may be regarded as virtually a short-circuit, then the output of the reference generator Vref is reflected to the inverting input of the amplifier 36. The reference resistor $R_{34}$ is put between the non-inverting input and the power supply Vcc; accordingly, the current flowing therein is automatically determined to be $(Vcc-V_{ref})/R_{ref}$, where $R_{ref}$ is the resistance of the reference resistor $R_{34}$. This current is provided to the base of the source transistor $Q_{32}$ via the pnp-transistor $Q_{33}$ as the base current $Ib_s$. Thus, the base current $Ib_s$ is reversely proportional to the resistance $R_{ref}$ of the reference resistor $R_{34}$.

When the reference resistor $R_{34}$ is formed simultaneously with the resistor $R_{51}$, they show similar scattering. Accordingly, when the resistance of the resistor $R_{51}$ increases from the designed value, which results in the excess compensation of the differential gain, the resistance of the reference resistor $R_{34}$ also increases, which operates to reduce the base current $Ib_s$ of the source transistor $Q_{32}$. The reduction of the base current $Ib_s$ is directly reflected to the reduction of the other base current $Ib_{22}$; accordingly, the excess compensation due to the increases of the resistance of the resistor $R_{51}$ is effectively cancelled by the reduction of the base current $Ib_{22}$ flowing therein. The mechanism to cancel the variation of the resistance is applicable to a case where the resistance is less than the designed value. In such a case, the base current $Ib_{22}$ increases and the compensation for the differential gain of the amplifying unit 2 can be adequately maintained.

Figure 8B:
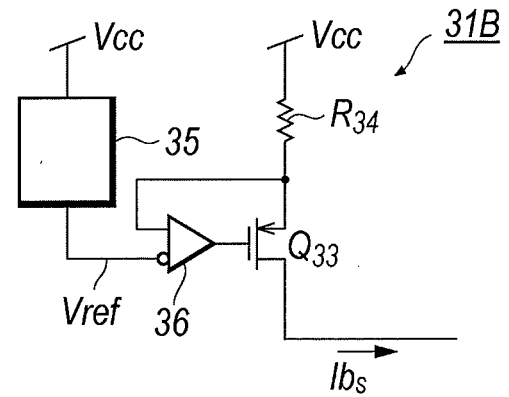
FIG. 8B shows the constant current source for the base current where the pnp-transistor in FIG. 8A is replaced by a p-MOSFET.

The pnp-transistor $Q_{33}$ may be replaced by a MOS transistor as shown in FIG. 8B. A MOS transistor ignores the gate current. In a case of a bipolar transistor, the base current should be considered. Specifically, the emitter current flowing in the emitter of the transistor $Q_{33}$ in FIG. 8B is determined by the reference voltage Vref and the resistance of the resistor $R_{34}$. However, the collector current outgoing from the collector, which is the base current $Ib_s$ of the transistor $Q_{32}$, exactly becomes a current subtracted by the base current from the emitter current. When the current gain of this pnp-transistor $Q_{34}$ is relatively small, the contribution of the base current to the collector current must be considered.

The current source circuit 31B shown in FIG. 8B provides, instead of the pnp-transistor, the MOSFET. As described above, the MOSFET can ignore the gate bias current, that is, the source current coming into the source is equal to the drain current outgoing from the drain, which is the base current $Ib_s$ to the source transistor $Q_{32}$.

Figure 8C:
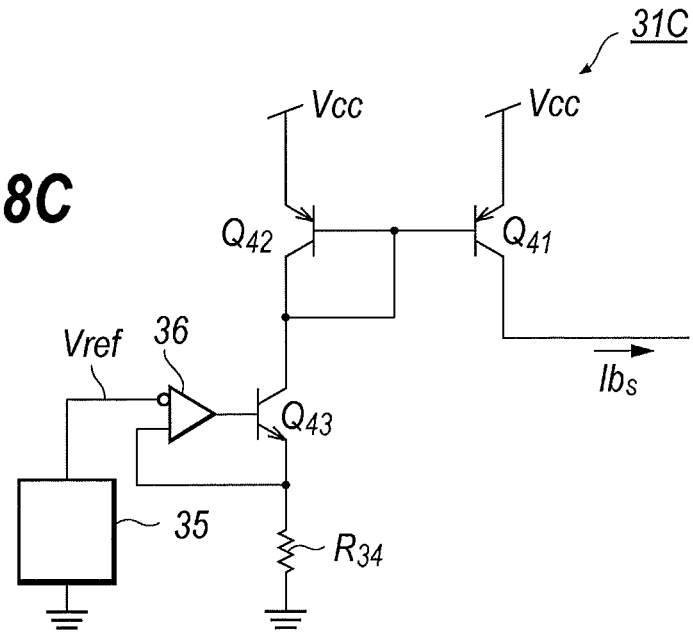
FIG. 8C shows the still modified current source for the constant base current.

Also, the constant current source can have an arrangement of a combination of npn-bipolar transistors and pnp-bipolar transistors, as shown in FIG. 8C. The constant current source circuit 31C in FIG. 8C includes a current mirror circuit constituted by two pnp-transistors, $Q_{41}$ and $Q_{42}$. The current mirror circuit reflects a collector current of one of transistors to the collector of the other of the transistors. In an arrangement shown in FIG. 8C, the collector current of the transistor $Q_{42}$ is reflected to the collector current of the other transistor $Q_{41}$, the latter current of which becomes the base current $Ib_s$ of the source transistor $Q_{32}$.

The former collector current outgoing from the transistor $Q_{42}$ is generated by the constant current source comprised of the npn-transistor $Q_{43}$, the reference resistor $R_{34}$, the differential amplifier 36 and the reference generator 35. Specifically, because two inputs of the differential amplifier 36 can be regarded as the imaginary short circuit, the reference voltage Vref provided from the reference generator 35 is reflected to the non-inverting input of the amplifier 36. Then, the current flowing in the reference resistor $R_{34}$ is set to be Vref/Rref, where Rref is the resistance of the reference resistor $R_{34}$. Assuming the current gain of the transistor $Q_{43}$ is large enough, that is, the base current is far smaller than the collector current and/or the emitter current, the current flowing in the reference resistor $R_{34}$ is reflected to the collector current.

The current mirror circuit reflects this collector current of the transistor $Q_{43}$, which is equal to the collector current of the transistor $Q_{42}$, to the collector current of the other transistor $Q_{41}$, which is the base current $Ib_s$ of the source transistor. Thus, the base current $Ib_s$ of the source transistor $Q_{32}$ depends on the resistance of the reference resistor $R_{34}$. The transistors, $Q_{33}$, $Q_{41}$ and $Q_{42}$, may be replaced by MOSFETs, or any other equivalent active devices.

Figure 9A:
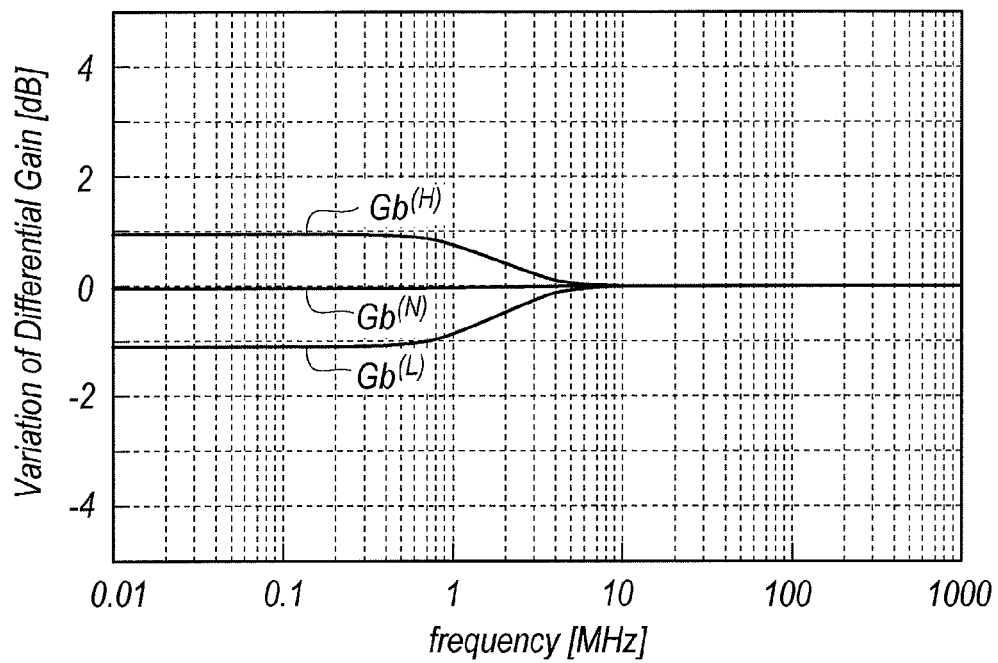
FIGS. 9A and 9B compare the frequency response of the differential gain, where the function to cancel the scattering of the current gain of the transistor is eliminated in FIG. 9A, while, the function is implemented in FIG. 9B.
Figure 9B:
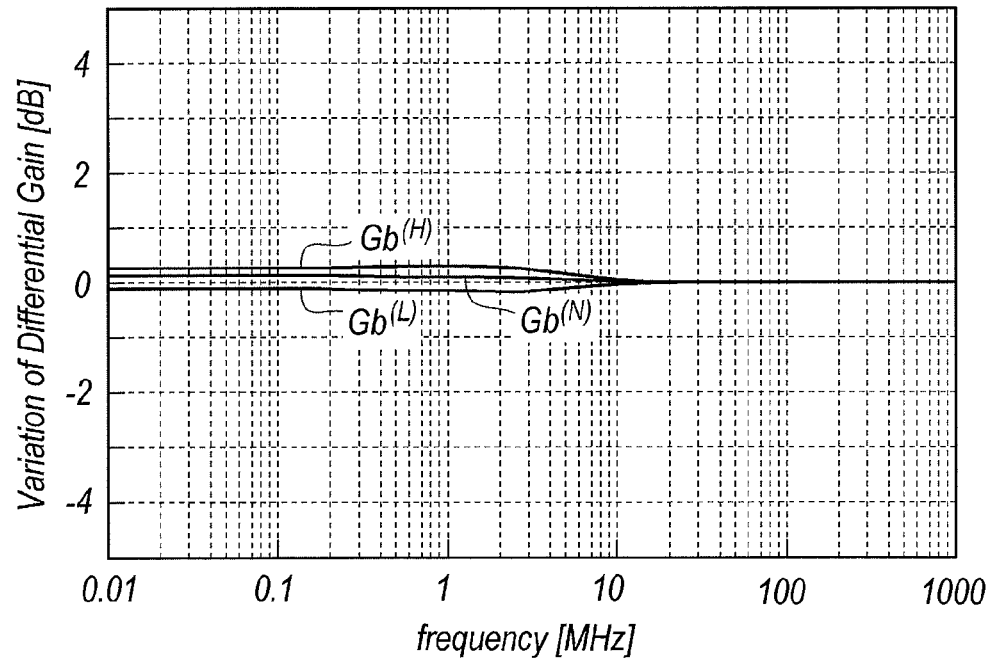

FIGS. 9A and 9B compare the frequency response of the differential gain of differential amplifiers implemented with the current source arrangement according to the first embodiment and that of the second embodiment, where the former has no elements to cancel the scattering of the current gain β of the transistors, while, the latter has a function to cancel the scattering of the current gain β. In these figures, $Gb^{(N)}$, $Gb^{(H)}$, and $Gb^{(L)}$ correspond to cases when β is a just designed value, an enhanced value, and an insufficient value, respectively.

When the current gain $β_2$ of the transistor $Q_{22}$ is the designed value, the variation of the differential gain in low frequencies can be ignorable, that is, the substantially flat response of the amplifying unit 2 can be realized. However, when the current gain $β_2$ is greater or smaller than the designed value, the differential gain of the amplifying unit 2 enhances or lowers about 1 dB in low frequencies below 1 MHz.

When the cancellation of the deviation of the current gain $β_2$ of the transistor $Q_{22}$ from the designed value is implemented, the variation of the differential gain in low frequencies can be suppressed to about 0.2 dB. Thus, the variation of the differential gain in low frequencies is compensated by implementing with the function to drive the current source in the constant base current mode.

Figure 10A:
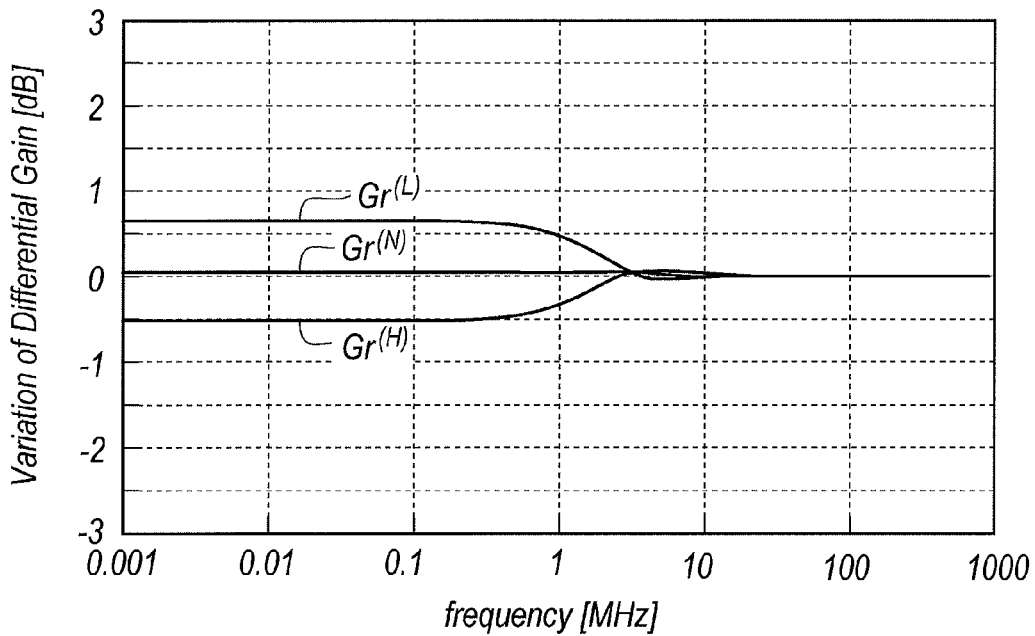
FIGS. 10A and 10B compare two cases of without and with the function to cancel the scattering of the resistance of the resistor in the low-pass filter.
Figure 10B:
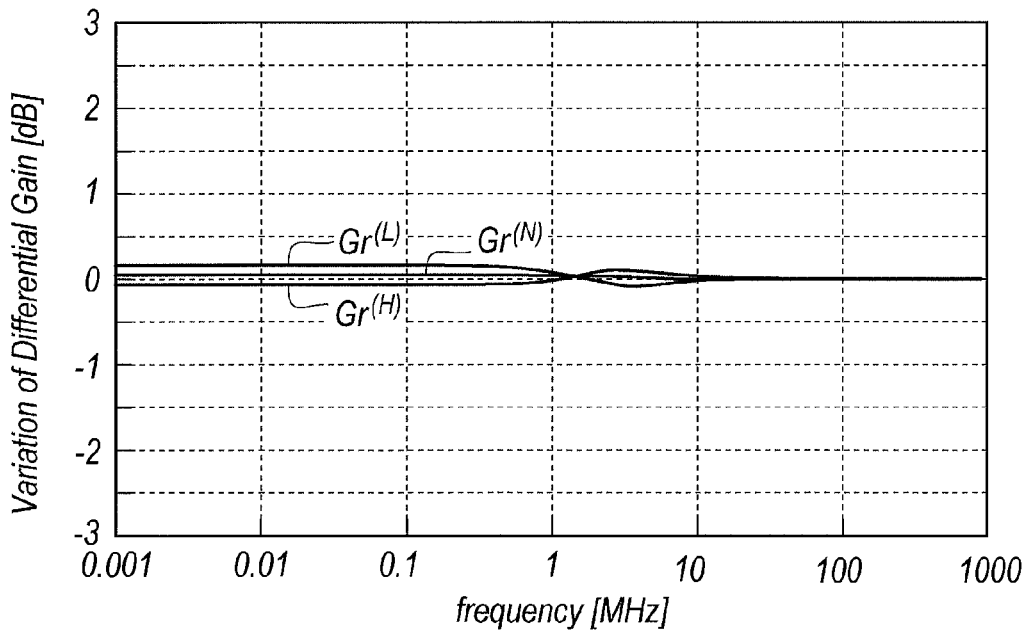

FIGS. 10A and 10B compare the function of compensating the scattering of the resistance of the resistor $R_{51}$, where FIG. 10A shows the variation of the differential gain of the amplifying unit 2 where behaviors $Gr^{(N)}$, $Gr^{(H)}$, and $Gr^{(L)}$ correspond to cases when the resistance is the designed value, greater than that value, and smaller than that value, respectively. The resistance is just the designed value, the differential gain shows a flat response against frequencies, but the differential gain increases/decreases when the resistance deviates from the designed one by 0.5 to 0.6 dB from that in high frequencies where the self-heating is ignorable.

When the current source circuits include the reference resistor $R_{34}$ to compensate the scattering of the resistance, the variation of the differential gain in low frequencies is suppressed to less than 0.2 dB, as shown in FIG. 10B. Thus, by driving the source transistor $Q_{32}$ in the constant base current mode, moreover, the constant base current is determined by the reference resistor $R_{34}$, the variation of the differential gain of the amplifying unit 2 in low frequencies can be effectively suppressed even when the performances of the transistors and the resistors implemented in the differential circuit are scattered primarily due to the process instability.

In the foregoing detailed description, the circuits of the present invention have been described with reference to specific exemplary embodiments thereof. It will, however, be evident that various modifications and changes may be further made thereto without departing from the broader spirit and scope of the present invention. For instance, the specification describes that the cut-off frequency $fc_1$ of the first filter 5 is set substantially equal to the transition frequency. However, the cut-off frequency $fc_1$ may be lower than the transition frequency. Accordingly, the present specification and figures are to be regarded as illustrative rather than restrictive.

We claim:

1. A differential circuit, comprising:
    an amplifying unit with a pair of hetero-bipolar transistors to convert a mono-phase input signal received by one transistor of the paired transistors into two output signals complementary to each other;
    a first low-pass filter coupled with the other of the paired transistors and having a cut-off frequency smaller than a transition frequency of the other of the paired transistors; and
    a second low-pass filter to generate an average of the two output signals the average being provided to the other transistor of the paired transistors via the first low-pass filter,
    wherein the other transistor of the paired transistors shows a self-heating effect below the transition frequency,
    wherein the first low-pass filter and the second low-pass filter have an emitter follower therebetween, and
    wherein the cut-off frequency of the first low-pass filter is 2 to 4 MHz.

2. The differential circuit of claim 1,
    wherein the second low-pass filter has a cut-off frequency less than the cut-off frequency of the first low-pass filter.

3. The differential circuit of claim 1,
    wherein the amplifying unit further includes a current source circuit providing a source transistor, the source transistor being commonly connected to the paired transistors, and
    wherein the source transistor is driven under an operational mode of a constant base current.

4. The differential circuit of claim 3,
    wherein the source transistor and the paired transistors have respective current gains with scatterings around a center value thereof, and
    wherein the scatterings of the source transistor and the paired transistors show similar tendencies.

5. The differential circuit of claim 3,
    wherein the current source circuit includes a current source to generate the constant base current for the source transistor, the current source including a reference resistor whose resistance scatters around a center value thereof, and
    wherein the scattering of the resistance of the reference resistor shows a tendency similar to scattering of the resistance of a resistor in the first low-pass filter.

6. A differential circuit, comprising:
    an amplifying unit with a pair of hetero-bipolar transistors to convert a mono-phase input signal received by one transistor of the paired transistors into two output signals complementary to each other;
    a first low-pass filter coupled with the other transistor of the paired transistors and having a cut-off frequency of 2 to 4 MHz;
    a second low-pass filter to generate an average of the two output signals, the second low-pass filter having a cut-off frequency lower than the cut-off frequency of the first low-pass filter; and
    an emitter follower between the first low-pass filter and the second low-pass filter,
    wherein the average is provided to the other transistor of the paired transistors through the emitter follower and the first low-pass filter.

* * * * *